United States Patent
Fukunaga

[11] Patent Number: 6,125,451
[45] Date of Patent: Sep. 26, 2000

[54] SEMICONDUCTOR CHIP KIT HAVING FREQUENCY CONVERTER FUNCTION

[75] Inventor: Takashi Fukunaga, Yokohama, Japan

[73] Assignee: Kabushiki Kaisha Toshiba, Kawasaki, Japan

[21] Appl. No.: 09/095,892

[22] Filed: Jun. 11, 1998

[30] Foreign Application Priority Data

Jun. 13, 1997 [JP] Japan .................................. 9-156885

[51] Int. Cl.[7] .................................................. G06F 1/04
[52] U.S. Cl. ............................................ 713/500; 713/600
[58] Field of Search ............................ 713/500, 600, 713/601, 400, 501–503; 708/103; 341/61, 100; 358/13; 375/40, 371; 377/47; 712/10, 11, 221; 710/25

[56] References Cited

U.S. PATENT DOCUMENTS

| | | | |
|---|---|---|---|
| 4,773,081 | 9/1988 | Morimoto | 375/40 |
| 4,843,455 | 6/1989 | Suzuki | 358/13 |
| 5,287,269 | 2/1994 | Bays et al. | 708/103 |
| 5,347,558 | 9/1994 | Nikjou | 377/47 |
| 5,455,840 | 10/1995 | Nakauchi et al. | 375/371 |
| 5,808,571 | 9/1998 | Kuwata et al. | 341/100 |
| 5,990,811 | 11/1999 | Morimoto | 341/61 |

OTHER PUBLICATIONS

TA31195FN, pp. 1–9, Aug. 22, 1997.
TA31196FN, pp. 1–11, Aug. 22, 1997.

*Primary Examiner*—Reba I. Elmore
*Assistant Examiner*—Rijue Mai
*Attorney, Agent, or Firm*—Oblon, Spivak, McClelland, Maier & Neustadt, P.C.

[57] ABSTRACT

A clock frequency converter circuit 30 is provided in a first IC 21 within a semiconductor chip kit SCK. Input clock signals CK1 different in clock frequency introduced from a clock generator 10 are converted into an output clock signal CK2 with a predetermined specific clock frequency in the clock frequency converter circuit 30, and the output clock signal CK2 is used as an activating clock signal of the fist IC 21, second IC 22 and third IC 23. Thus, the semiconductor chip kit can easily cope with changes in clock frequency of the input clock signal CK1.

25 Claims, 12 Drawing Sheets

SEMICONDUCTOR CHIP KIT HAVING FREQUENCY CONVERTER FUNCTION

BACKGROUND OF THE INVENTION

1. Field of the Invention

This invention relates to a semiconductor chip kit, especially of a type permitting clock signals with a plurality of clock frequencies to be input.

2. Description of the Prior Art

Figure 9:
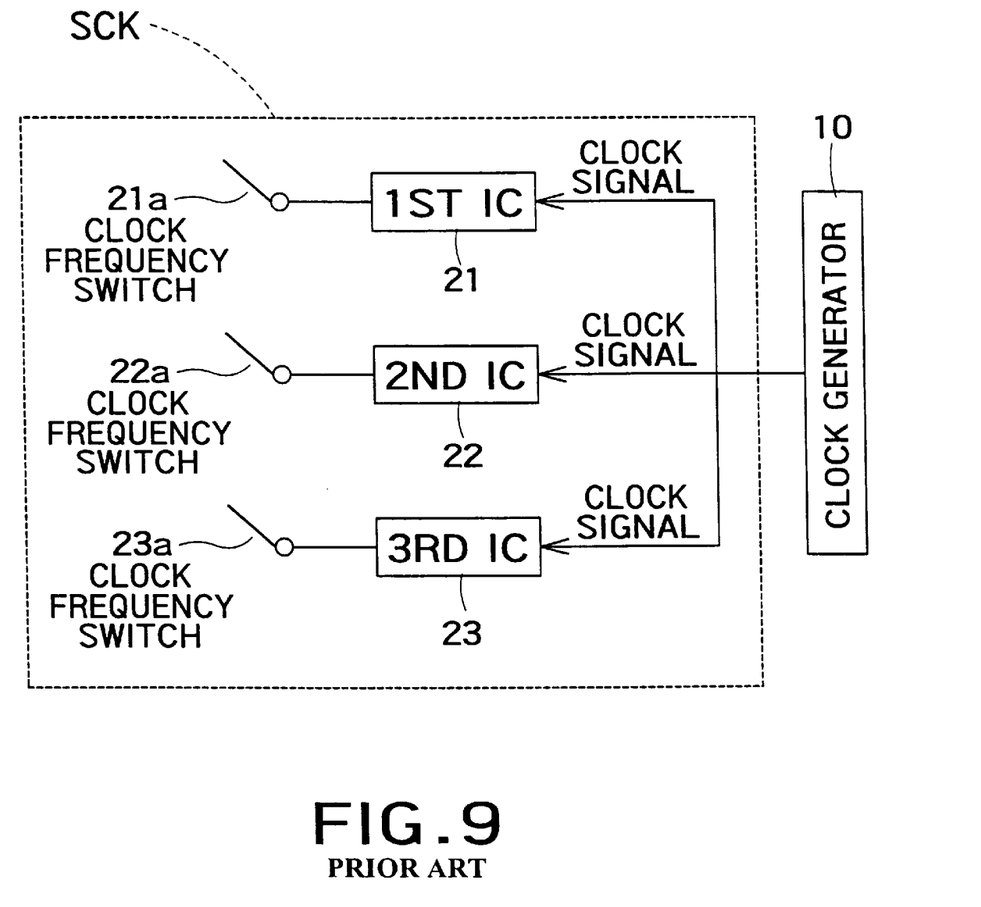
FIG. 9 is a diagram showing a conventional semiconductor chip kit.

A semiconductor chip kit as shown in FIG. 9 has been used conventionally as one having a plurality of ICs requiring clock signals. The semiconductor chip kit SCK as shown in FIG. 9 has been used as a circuit in a high frequency portion in a portable terminal of a mobile wireless system, for example. PLL-IC (phase-locked loop IC) and IF-IC (intermediate frequency IC) having built-in filters are examples of ICs requiring a clock signal. The semiconductor chip kits SCK of this type are configured to supply a clock signal to individual ICs from a single clock generator. That is, as shown in FIG. 9, a single clock generator 10 supplies a clock signal to individual ICs, i.e., the fist IC 21, second IC 22 and third IC 23. The clock generator 10 used as the clock supply source most typically used in semiconductor chip kits SCK in mobile wireless systems is TCXO (temperature-compensated Xeal oscillator) for a synthesizer.

In the semiconductor chip kit SCK shown in FIG. 9, it was often necessary to change the clock frequency of the clock signal generated by the clock generator 10. Especially in semiconductor chip kits SCK used in mobile wireless systems, the clock frequency of the clock signal generated by the clock generator 10 had to be more often changed for the purpose of avoiding cross modulation with peripheral circuits, commonly using it with a control clock, or permitting peripheral circuits to be made by using general purpose chips. When the clock frequency of the clock signal generated by the clock generator 10 is changed, also the clock frequency of the first IC 21, second IC 22 and third IC 23 heretofore receiving the clock signal from the clock generator 10 had to be changed. That is, all of ICs had to be changed in specification to change the clock frequency. In this case, all ICs had to be redesigned, and a great deal of labor was required therefor.

As shown in FIG. 9, some semiconductor chip kits had clock frequency switches 21a, 22a, 23a provided for the first IC 21, second IC 22 and third IC 23 for switching clock signals to meet different kinds of clock frequencies to a certain extent. That is, such semiconductor chip kits were configured to change over circuits on the part of ICs to cope with different kinds of clock frequencies. In this case, however, clock frequency changeover switches 21a, 22a and 23a were required outside the first IC 21, second IC 22 and third IC 23, respectively, and there arose the need for more IC pins and a bulky scale of IC. In other words, the use of such switches was away from the requirements of reducing IC pins and miniaturization of ICs. Additionally, ICs had to be designed on presumption of possible clock frequencies to switch to. Nevertheless, for clock frequencies other than those the ICs were designed for, all ICs still had to be replaced.

Moreover, since all of the first IC 21, second IC 22 and third IC 23 were supplied with a clock signal from a single clock generator 10, the load to the clock generator 10 was too heavy. Therefore, a buffer device had to be provided to assist the clock generator 10, and it invited an increase in number of parts or elements.

SUMMARY OF THE INVENTION

It is therefore an object of the invention to provide a semiconductor chip kit readily coping with changes in clock frequency of a clock signal generated by the clock generator 10. It is a further object of the invention to provide a semiconductor chip kit which can cope with large changes in clock frequency of the clock generator 10 by replacing one or some of ICs. That is, it is an object of the invention to provide a semiconductor chip kit enabling reduction of pins and miniaturization while flexibly coping with changes in clock frequency.

According to the invention, there is provided a semiconductor chip kit comprising:

a clock frequency converter circuit supplied with an input clock signal having any one of different in clock frequencies to frequency-convert the input clock signal into an output clock frequency with a predetermined single specific clock frequency to be output; and one or more integrated circuits supplied with and activated by the output clock signal from the clock frequency converter circuit, the integrated circuits being operative only when they receive the output clock signal of the predetermined specific clock frequency.

There is also provided a semiconductor chip kit comprising:

a receiving IF-IC which receives a wireless signal from the exterior to convert it into a base band signal;

a transmission IF-IC which receives the base band signal to supply it as a wireless signal to the exterior; and a clock frequency converter circuit provided in one of the receiving IF-IC and said transmission IF-IC and having a plurality of divider circuits supplied with an input clock signal having any one of different in clock frequencies to convert the input clock signal into an output clock signal of a predetermined specific clock frequency, the input clock signal being converted into the specific clock frequency in one of the divider circuits and being supplied as an output clock signal to the other of the receiving IF-IC and the transmission IF-IC.

There is further provided a semiconductor chip kit comprising:

a digital receiving IF-IC which receives a digital wireless signal from the exterior to convert it into a base band signal;

an analog receiving IF-IC which receives an analog wireless signal from the exterior to convert it into the base band signal;

a transmission IF-IC which receives the base band signal to supply it as a wireless signal to the exterior;

a PLL-IC for supplying a local signal; and a clock frequency converter circuit provided in the PLL-IC and having a plurality of divider circuits supplied with an input clock signal having any one of different in clock frequencies to frequency-divide the input clock signal into an output clock signal of a predetermined specific clock frequency, the input clock signal being converted into the specific clock frequency in one of the divider circuits and being supplied as said output clock signal to one of the digital receiving IF-IC, analog receiving IF-IC and transmission IF-IC.

There is further provided a semiconductor chip kit comprising:

a clock frequency converter circuit supplied with an input clock signal having any one of different in clock frequencies, and having a plurality of divider circuits for converting the input clock signal into an output clock signal with a predetermined specific clock frequency which is a common divisor of the clock frequencies of the input clock signal and for supplying said output clock signal; and one or more integrated circuits supplied with and activated by the output clock signal from the clock frequency converter circuit, the integrated circuits being operative only when they receive the output clock signal of the specific clock frequency.

According to the invention, there is also provided a mobile wireless system using a semiconductor chip kit wherein the semiconductor chip kit comprises:

a clock frequency converter circuit supplied with an input clock signal having any one of different in clock frequencies to frequency-convert the input clock signal into an output clock frequency with a predetermined single specific clock frequency to be output; and one or more integrated circuits supplied with and activated by the output clock signal from the clock frequency converter circuit, the integrated circuits being operative only when they receive the output clock signal of the specific clock frequency.

DETAILED DESCRIPTION OF THE PREFERRED EMBODIMENTS (First Embodiment)

The first embodiment of the invention uses a clock frequency converter circuit provided in one of ICs in a semiconductor chip kit to convert an input clock signal of a plurality of different clock frequencies received from a clock generator into an output clock signal of a predetermined clock frequency and to use it as an operating clock signal of a plurality of ICs so as to readily cope with changes in clock frequency of the clock signal generated by the clock generator. It is explained below in greater detail with reference to the drawings.

Figure 1:
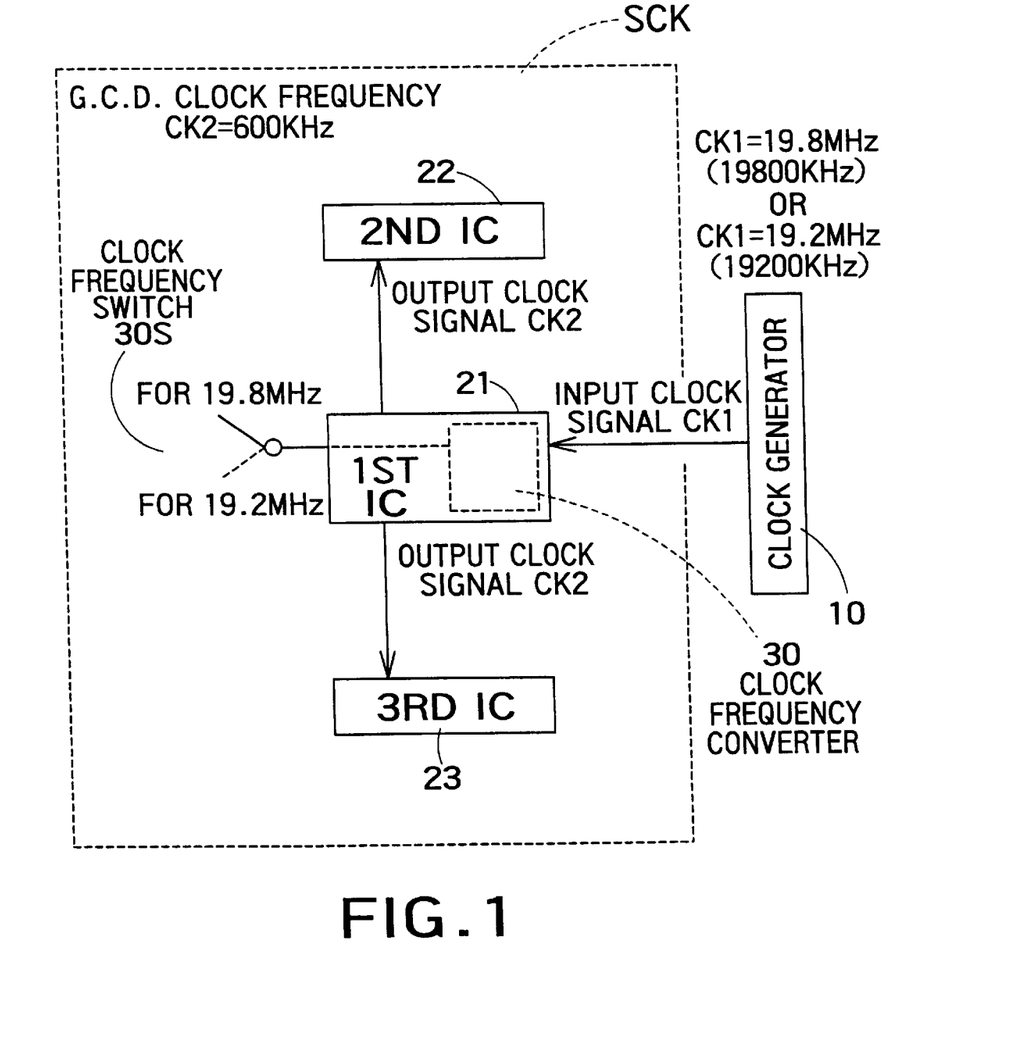
FIG. 1 is a diagram showing a semiconductor chip kit according to the first embodiment of the invention.

FIG. 1 is a diagram showing a semiconductor chip kit SCK and a clock generator 10 according to the first embodiment of the invention.

As shown in FIG. 1, the semiconductor chip kit SCK is supplied with an input clock signal CK1 from the clock generator 10. The clock frequency of the input clock signal CK1 from the clock generator 10 may be changed by changing the design. Assume here that the clock frequency may be changed to or from 19.8 MHz or 19.2 MHz.

The semiconductor chip kit SCK includes a first IC 21, second IC 22 and third IC 23. Introduced into the first IC 21 is the input clock signal CK1 from the clock generator 10. The first IC 21 contains a clock frequency converter circuit 30. Therefore, the introduced input clock signal CK1 is converted in clock frequency by the clock frequency converter circuit 30. That is, the clock frequency converter circuit 30 divides the clock frequency of the input clock signal CK1, and converts it into output clock signal CK2. In this embodiment, output clock signal CK2 has the clock frequency of 600 kHz. The first IC 21 operates in response to the converted output clock signal CK2.

The first IC 21 has a clock frequency changeover switch 30S. By changing connection of the clock frequency changeover switch 30S, the first IC 21 receives the input clock signal CK1 containing a plurality of clock frequencies to convert it into the output clock signal CK2 of a predetermined specific clock frequency. In the embodiment shown here, whichever of clock frequencies 19.8 MHz and 19.2 MHz the received signal CK1 has, the first IC 21 converts it into the output clock signal CK2 with the clock frequency of 600 kHz.

The output clock signal CK2 is output to the second IC 22 and the third IC 23. The second IC 22 and the third IC 23 operate in response to the output clock signal CK2. The first IC 22 and the third IC 23 are the same as conventional ICs which operate in response to a clock signal with a predetermined specific clock frequency. The second IC 22 and the third IC 23 don't have a clock frequency changeover switch. In the embodiment shown here, both the second IC 22 and the third IC 23 operate at the clock frequency of 600 kHz. Therefore, all ICs provided in the semiconductor chip kit SCK, including the first IC 21, are designed to operate only at 600 kHz.

Figure 2:
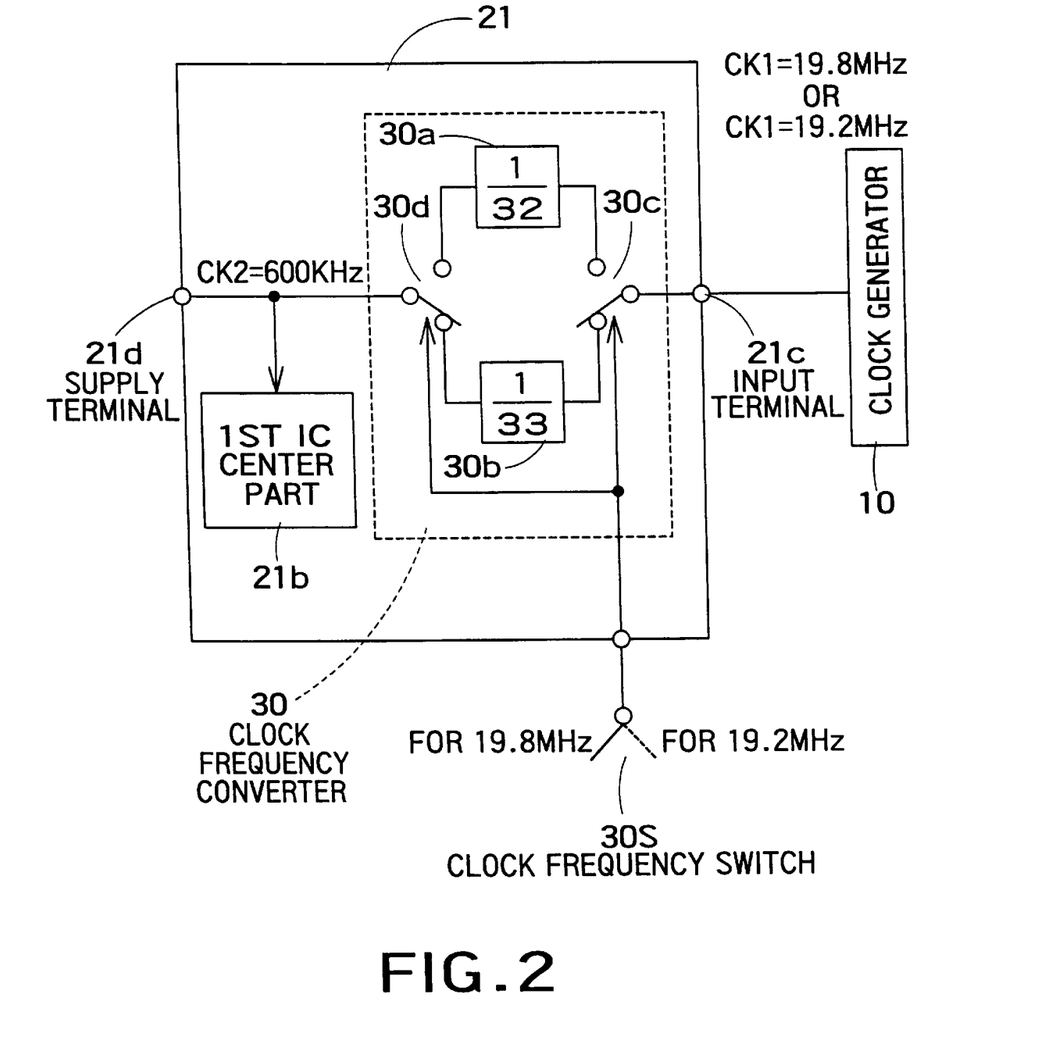
FIG. 2 is a diagram showing the interior structure of the first IC shown in FIG. 1.

FIG. 2 is a diagram showing an arrangement of the first IC 21. As shown in FIG. 2, the first IC 21 includes the clock frequency converter circuit 30 and a first IC central part 21b. The clock frequency converter circuit 30 is a circuit element for converting clock frequencies in the input clock signal CK1. The first IC central part 21b is a circuit element for essential behaviors as the first IC 21.

The clock frequency converter circuit 30 includes clock divider circuits 30a and 30b. The clock divider circuit 30a divides the frequency of the introduced clock signal into 1/32. The clock divider circuit 30b divides the frequency of the introduced clock signal into 1/33. These clock divider circuits 30a, 30b are switched by internal switches 30c and 30d. These internal switches 30c, 30d are linked to the clock frequency changeover switch 30S. By changing connection of the clock frequency changeover switch 30S, the clock frequency converter circuit 30 can be changed to operate as the 1/32 divider circuit or the 1/33 divider circuit. Therefore, using the clock divider circuit 30b when the input clock signal CK1 introduced through the input terminal 21c has the frequency 19.8 MHz (19800 kHz) and using the clock divider circuit 30a when the input clock signal CK1 when the input clock signal CK1 has the frequency 19.2 MHz (19200 kHz), the clock frequency of the output clock signal CK2 can be changed to 600 kHz. The output clock signal CK2 is input to the first IC central part 21b, and can be output from the supply terminal 21d to another IC outside it.

Figure 2A:
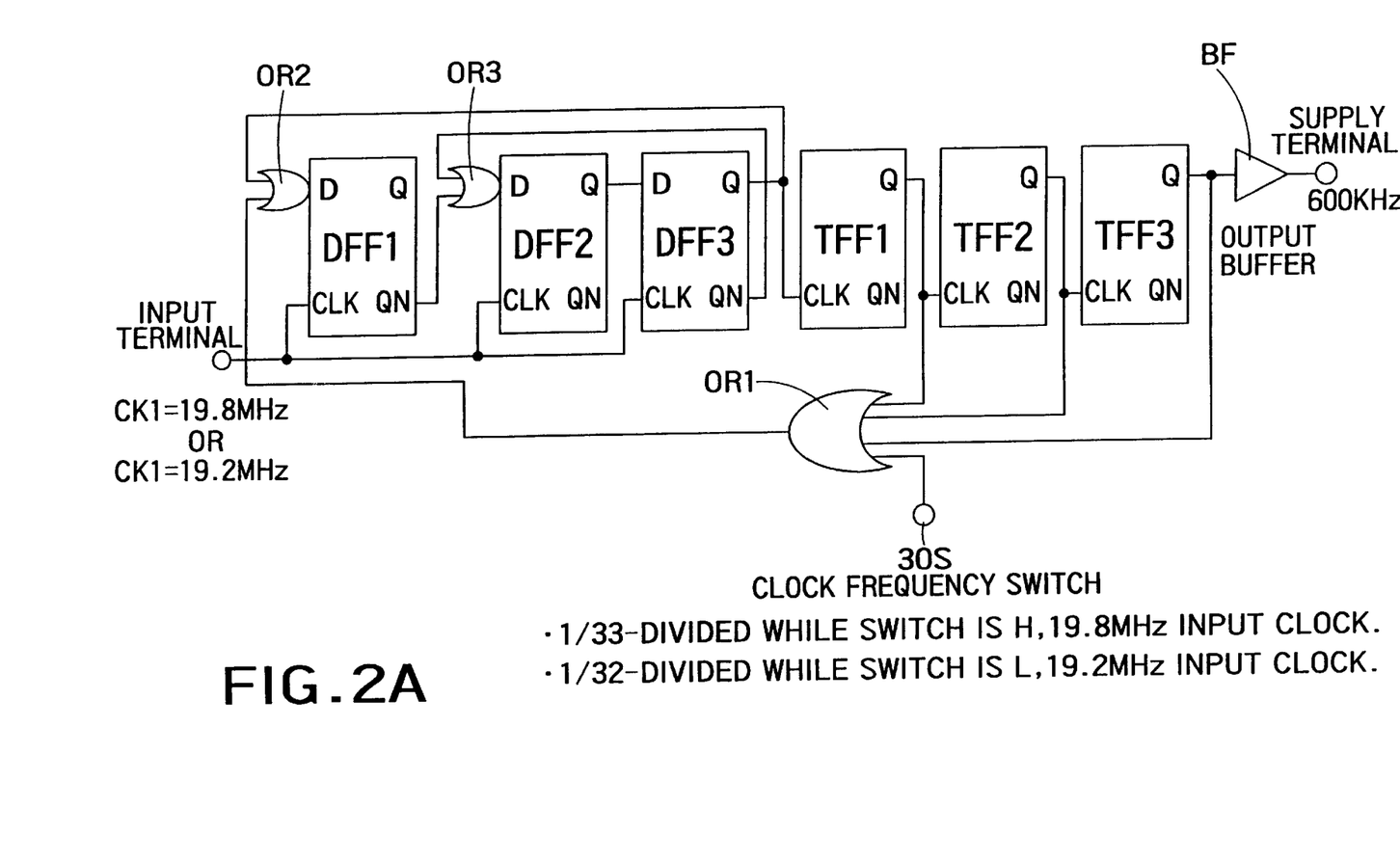
FIG. 2A is a diagram showing a specific circuit arrangement of a clock frequency converter circuit shown in FIG. 2.

FIG. 2A is a diagram showing a specific circuit arrangement of the clock frequency converter circuit 30 shown in FIG. 2. As shown in FIG. 2A, the clock frequency converter circuit 30 includes D-type flip-flop circuits DFF1 through DFF3, T-type flip-flop circuits TFF1 through TFF3, OR logic circuits OR1 through OR3, and output buffer circuit BF which are connected as illustrated.

Figure 3:
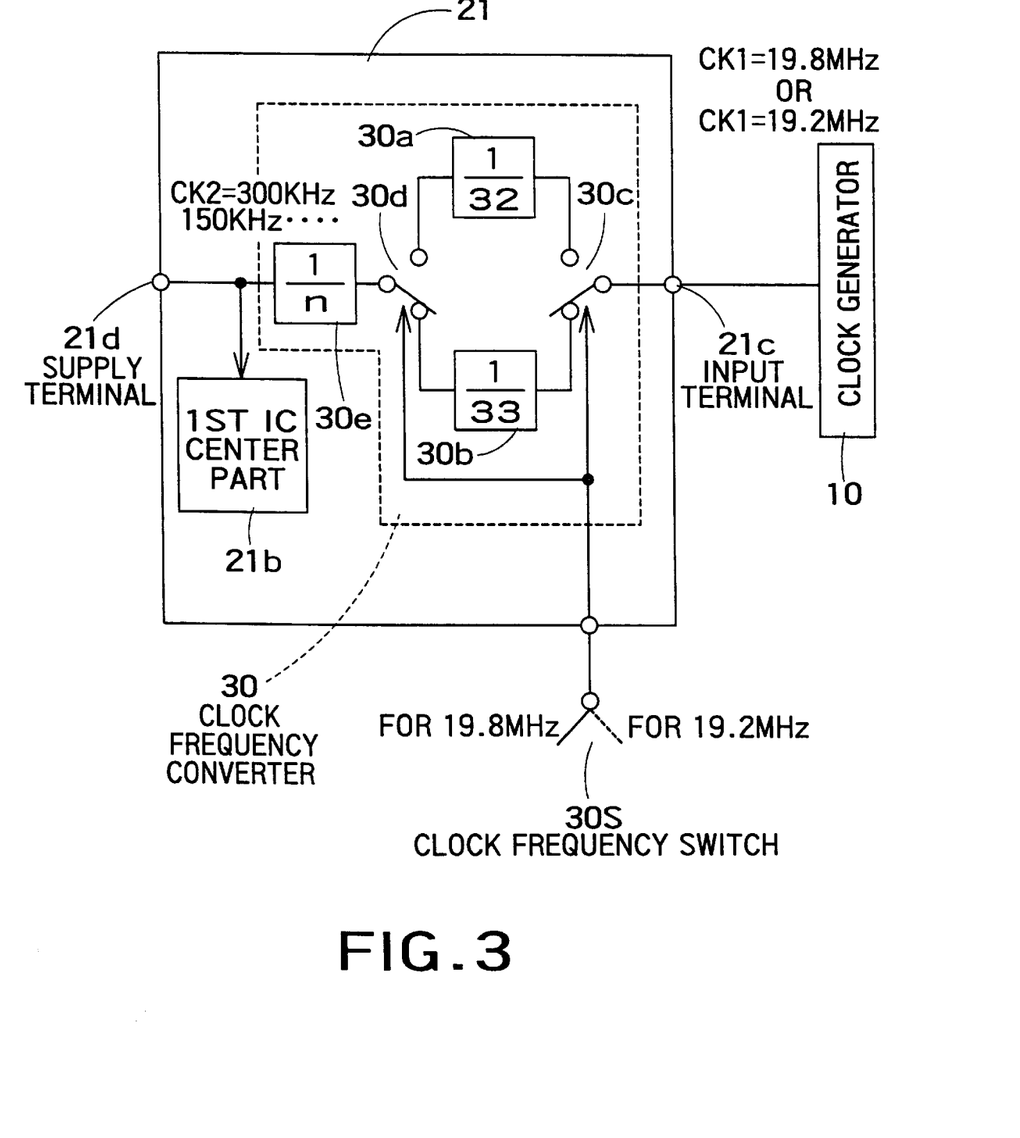
FIG. 3 is a diagram showing a modification of the first IC shown in FIG. 2.

The clock frequency 600 kHz of the output clock signal CK2 is the greatest common divisor of the clock frequencies 19.8 MHz and 19.2 MHz of the input clock signal CK1. However, it may be any of their common divisors. That is, as shown in FIG. 3, by providing a clock divider circuit 30e next to the internal switch 30d in the clock frequency converter circuit 30, output clock signals CK2 with clock frequencies 300 kHz, 150 kHz, . . . can be made. In this case, the first IC central part 21b and external ICs must operative at clock frequencies 300 kHz, 150 kHz, . . . .

Figure 3A:
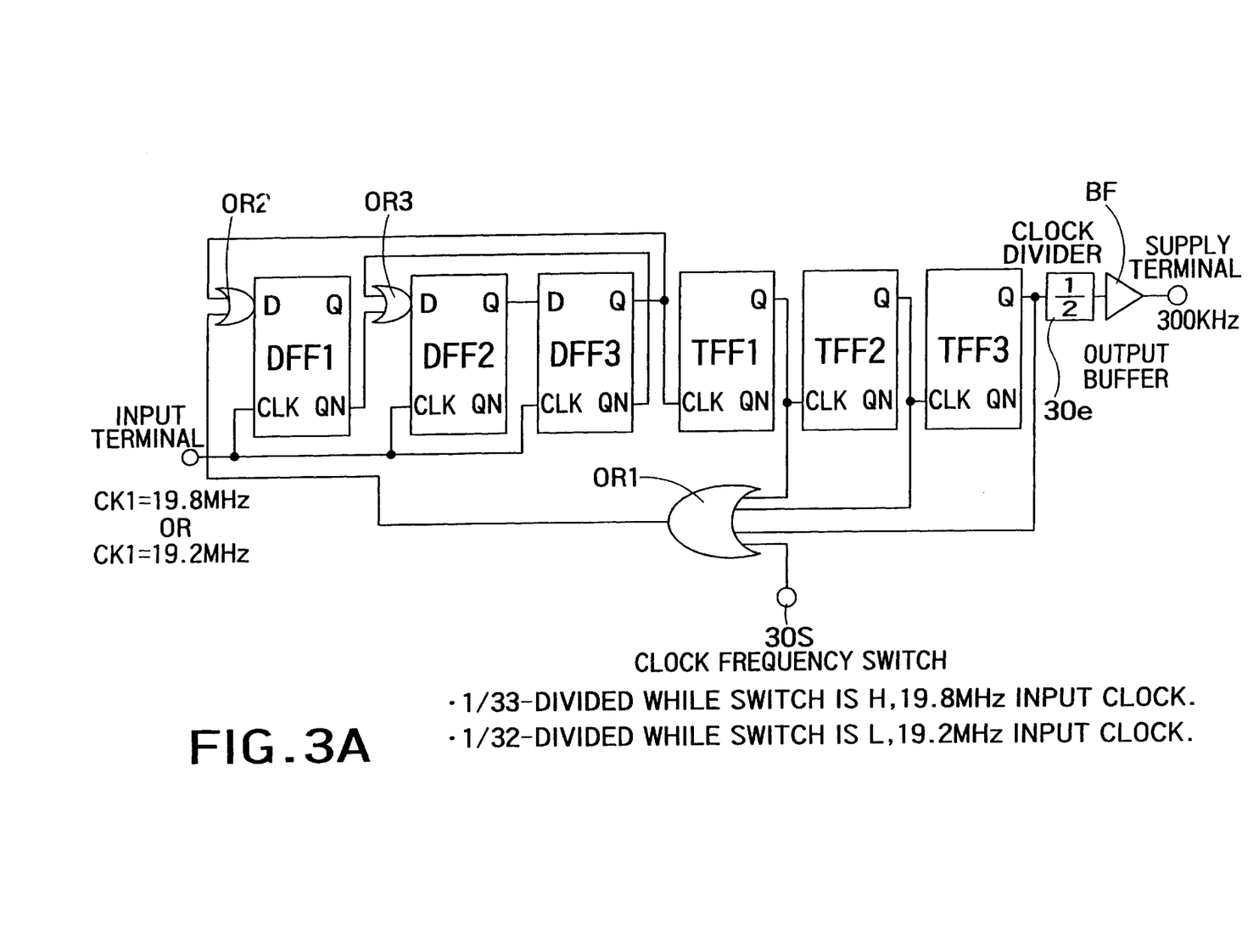
FIG. 3A is a diagram showing a specific circuit arrangement of the clock frequency converter circuit shown in FIG. 3.

FIG. 3A shows a specific circuit arrangement of the clock frequency converter circuit 30 shown in FIG. 3 when the clock divider circuit 30e of FIG. 3 is a ½ divider. As shown in FIG. 3A, the circuit 30 is made by additionally inserting the ½ clock divider circuit 30e between the T-type flip-flop TFF3 and the output buffer circuit BF.

Next made is an explanation in greater detail on entire behaviors of the embodiment. As shown in FIG. 1, let the clock frequency of the input clock signal CK1 generated by the clock generator 10 be 19.8 MHz. In this case, the clock frequency changeover switch 30S of the first IC 21 is changed into connection for 19.8 MHz. The input clock signal CK1 with 19.8 MHz generated by the clock generator 10 is input into the first IC 21 of the semiconductor chip kit SCK. The first IC 21 in receipt of the input clock signal CK1 converts the clock frequency in the clock frequency converter circuit 30. That is, the input clock signal CK1 of 19.8 MHZ (19800 kHz) is divided into ⅓₃ and converted into the output clock signal CK2 of 600 kHz. In response to the output clock signal CK2 of 600 kHz, the first IC 21 operates. The output clock signal CK2 of 600 kHz is output from the first IC 21 to the second IC 22 and the third IC 23, and the second IC 22 and the third IC 23 operate responsively.

Next explained is the aspect where the clock frequency of the input clock signal CK1 generated by the clock generator 10 is changed to 19.2 MHz. In this case, the clock frequency changeover switch 30S of the first IC 21 is changed in connection for 19.2 MHz. The input clock signal CK1 of 19.2 MHz generated in the clock generator 10 is input into the first IC 21 of the semiconductor chip kit SCK. In receipt of the input clock signal CK1, the first IC 21 converts the clock frequency in the clock frequency converter circuit 30. That is, the input clock signal CK1 of 19.2 MHz (19200 kHz) is divided into ⅓₂ and converted into the output clock signal CK2 of 600 kHz. In response to the output clock signal CK2 of 600 kHz, the first IC 21 operates. The output clock signal CK2 of 600 kHz is output from the first IC 21 to the second IC 22 and the third IC 23, and these ICs 22 and 23 operate responsively.

As explained above, according to the first embodiment of the invention, the input clock signal CK1 is received at the first IC 21 having the clock frequency changeover circuit 30, and its clock frequency is converted into the output clock signal CK2 by the clock frequency changeover circuit 30 to use it to activate the first IC 21, second IC 22 and third IC 23. Therefore, it is sufficient to provide the clock frequency changeover circuit 30 in the first IC 21 alone, and the second IC 22 and the third IC 23 need no such circuit. As a result, pins of the second and third ICs 22, 23 can be reduced, and the kit can be miniaturized. In other words, clock frequency changeover circuits and their switches required for the second IC 22 and third IC 23 in the conventional kit can be omitted.

Additionally, the greatest common divisor of different clock frequencies of input clock signals CK1 which could be generated by the clock generator 10 is used as the clock frequency of the output clock signal CK2 required in each IC. Namely, 600 kHz is used as the clock frequency required in each IC whereas the clock frequencies for which redesigning is expected are 19.8 MHz (19800 kHz) and 19.2 MHz (19200 kHz). Therefore, as apparently known by comparison between the clock frequency converter circuit 30 of FIG. 2 and that of FIG. 3, the clock divider circuit 30e can be omitted. When the clock frequency converter circuit 30 shown in FIG. 3 is used, ICs operative at clock frequencies 300 kHz, 150 kHz . . . can be used. That is, according to the embodiment, any IC operative at a frequency corresponding to a common divisor of frequencies of input clock signals CK1 generated in the clock generator 10 can be used as IC in the semiconductor chip kit SCK.

Moreover, even when the clock frequency of the actually introduced input clock signal CK1 is other than the previously expected clock frequencies, it is sufficient to redesign only the first IC 21. That is, the second IC 22 and the third IC 23 need not be redesigned. Therefore, the kit can easily cope with any change in clock frequency of the input clock signal CK1 generated by the clock generator 10.

Further, the clock generator 10 may output the clock signal CK1 only to the first IC 21, and need not supply it to all ICs as required in the conventional kit. Therefore, the clock generator 10 is released from a heavy load, and needs no buffer. Thus, parts of the kit can be reduced.

(Second Embodiment)

The second embodiment of the of the invention separate the clock frequency converter circuit 30 from the first IC 21 used in the first embodiment and uses another IC operative as an independent clock frequency converter circuit.

Figure 4:
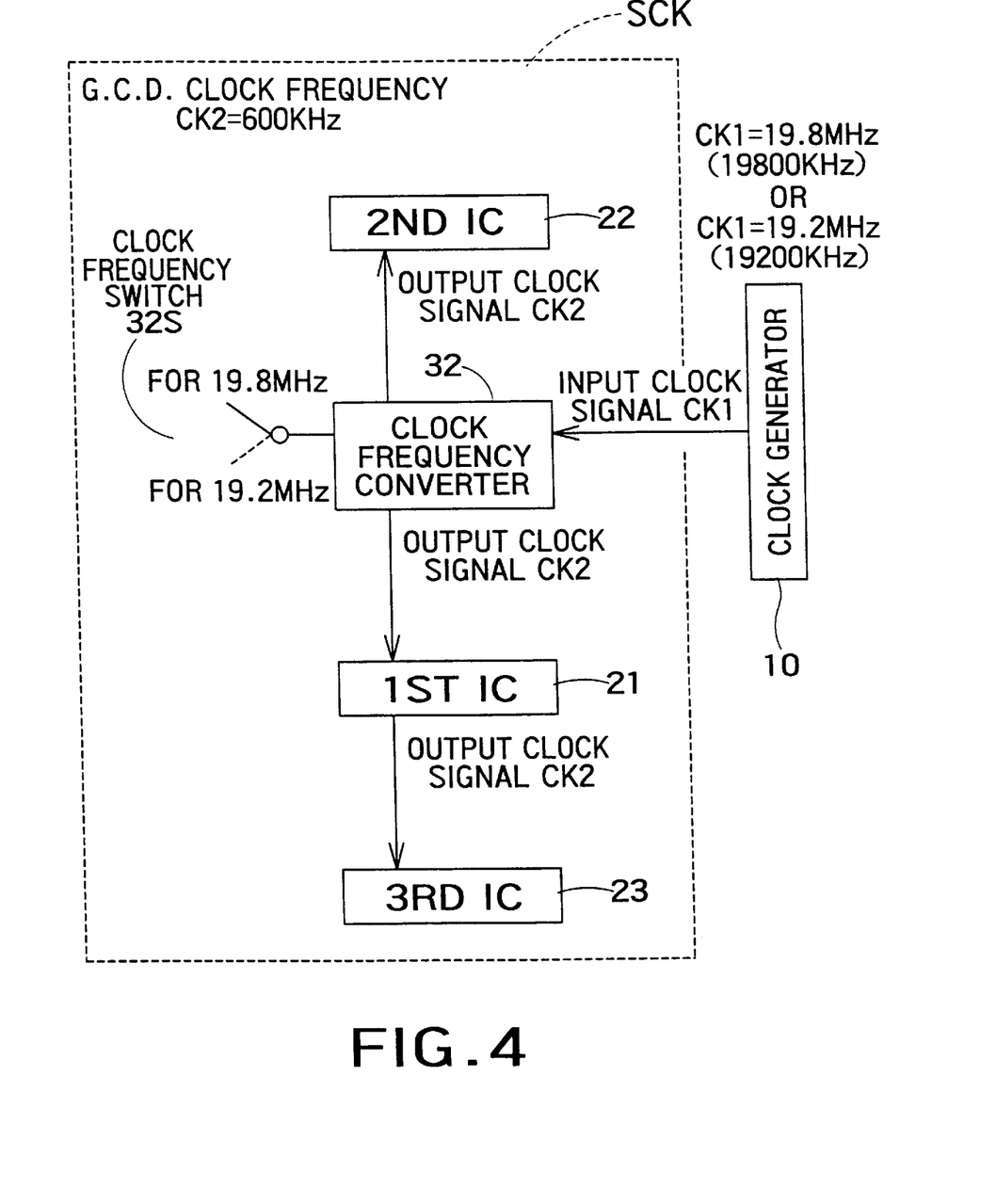
FIG. 4 is a diagram showing a semiconductor chip kit according to the second embodiment of the invention.

More specifically, as shown in FIG. 4, the input clock signal CK1 generated by the clock generator 10 is introduced into the clock frequency converter circuit 32. The clock frequency converter circuit 32 includes a clock frequency changeover switch 32S like that of the first embodiment. The clock frequency converter circuit 32 converts the frequency of the input clock signal CK1 into the output clock signal CK2 with a predetermined specific clock frequency. The clock frequency converter circuit 32 supplies the output clock signal CK2 to the first IC 21 and the second IC 22. The first IC 21 supplied with the output clock signal CK2 delivers it to the third IC 23. Thus, the first IC 21, second IC 22 and third IC 23 operate in response to the output clock signal CK2. The other features of the semiconductor chip kit SCK shown here is the same as those of the first embodiment, and their explanation is omitted here.

According to the second embodiment, the input clock signal CK1 from the clock generator 10 enters into the clock frequency converter circuit 32. Therefore, when the clock frequency of the input clock signal CK1 generated by the clock generator 10 is changed to any other than 19.8 MHz and 19.2 MHz, it is sufficient to replace only the clock frequency converter circuit 32. That is, the semiconductor chip kit can readily cope with changes in clock frequency of the input clock signal CK1 from the clock generator 10.

Figure 5:
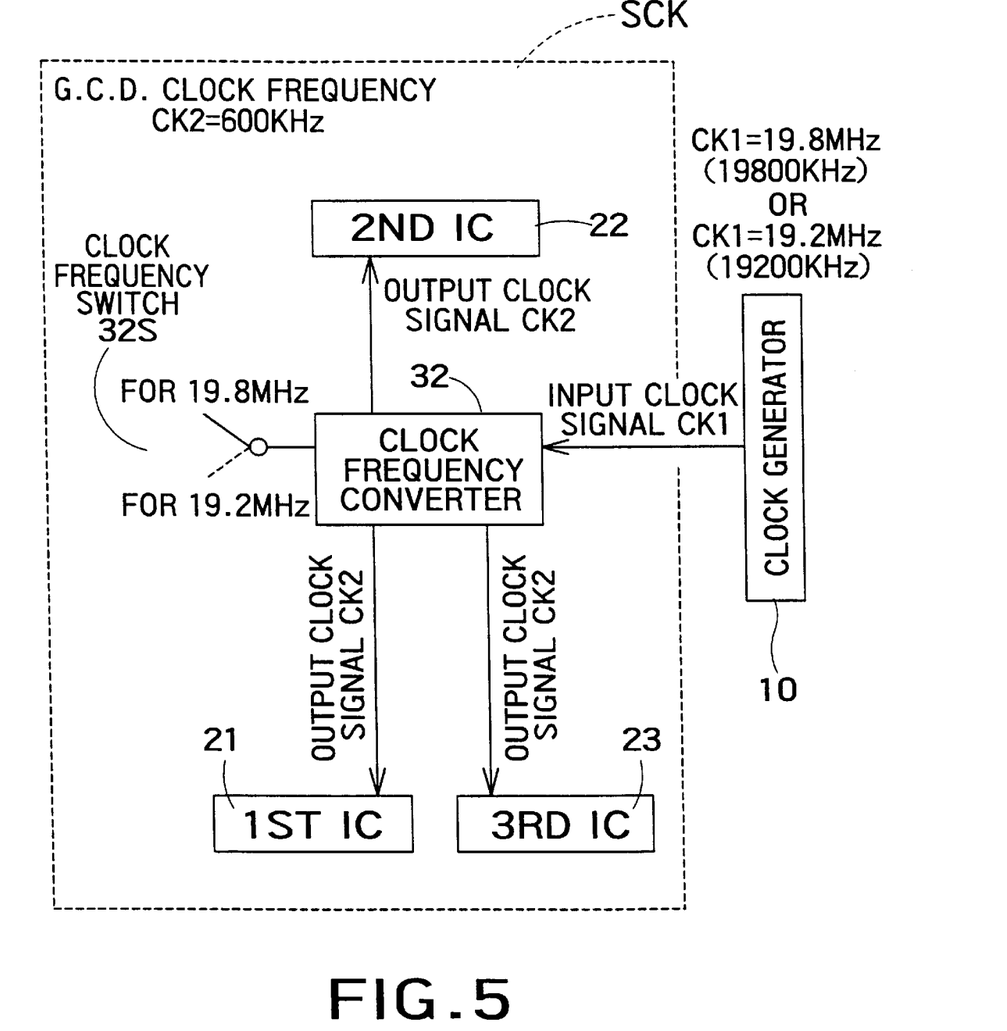
FIG. 5 is a diagram showing a modification of the second embodiment.

The second embodiment may be modified as shown in FIG. 5 where the output clock signal CK2 is supplied from the clock frequency converter circuit 32 directly to each of the first IC 21, second IC 22 and third IC 23.

(Third Embodiment)

The third embodiment is an application of the semiconductor chip kit according to the invention to a high frequency portion of a mobile wireless system. It is explained in greater detail with reference to FIG. 6.

Figure 6:
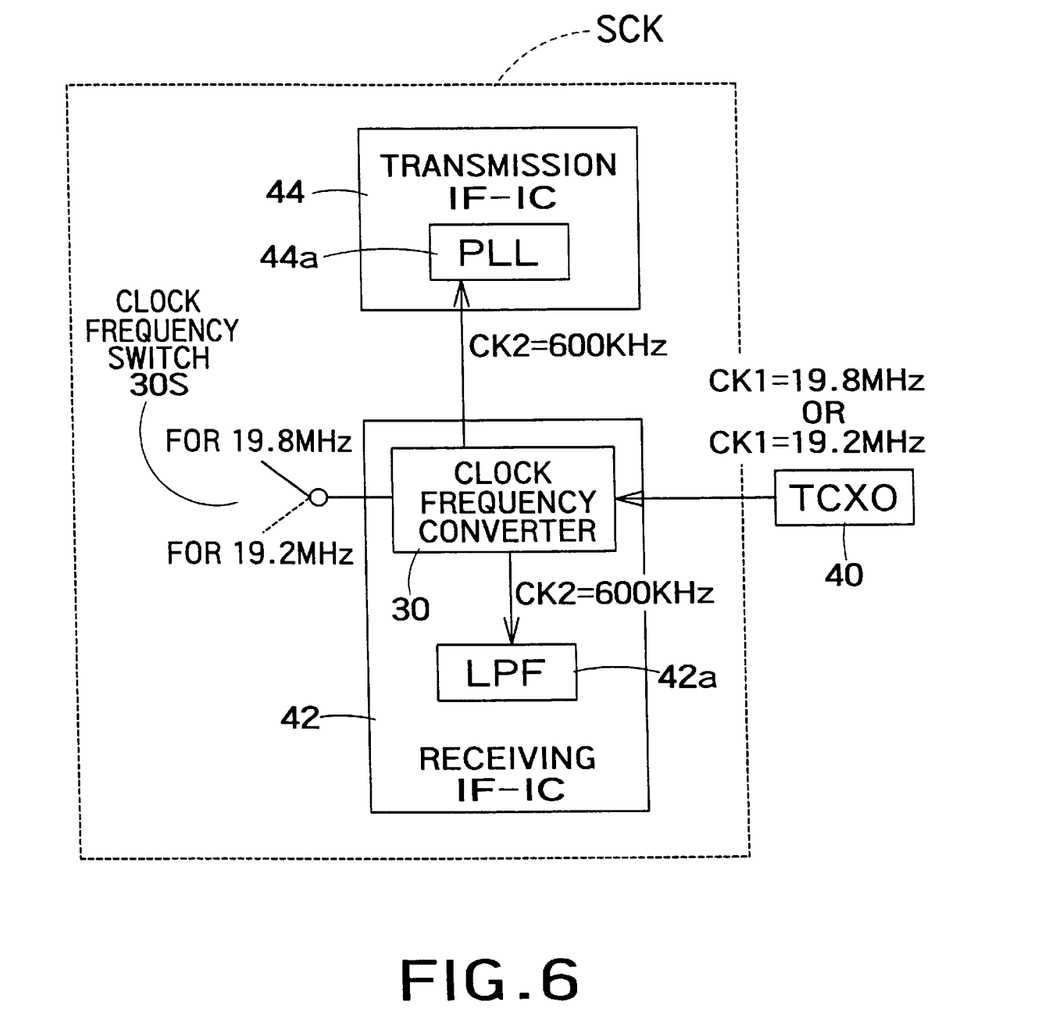
FIG. 6 is a diagram showing a semiconductor chip kit according to the third embodiment of the invention.

FIG. 6 shows the semiconductor chip kit SCK according to the third embodiment and TCXO 40. As shown in FIG. 6, the third embodiment includes the semiconductor chip kit SCK and TCXO 40. The semiconductor chip kit SCK contains a receiving IF-IC 42 and a transmission IF-IC 44 corresponding to ICs used in the foregoing embodiment.

TCXO 40 behaves as a clock generator. In the embodiment shown here, TCXO 40 is expected to have the specification for generating an input clock signal CK1 of the clock frequency 19.8 MHz or the specification for generating an input clock signal CK1 of the clock frequency 19.2 MHz.

The receiving IF-IC 42 is IC for receiving a wireless signal from the exterior and for converting it into a base band signal. The receiving IF-IC 42 includes a clock frequency converter circuit 30 and a low pass filter (LPF) 42a. The clock frequency converter circuit 30 has the same interior structure as those of the clock frequency converter circuit 30 used in the foregoing embodiments shown in FIG. 2 and FIG. 3. The clock frequency converter circuit 30 is configured to convert the input clock signal CK1 into the output clock signal CK2 with the clock frequency of 600 kHz, whichever of clock frequencies 19.8 MHz and 19.2 MHz the received signal CK1 has. The clock frequency converter circuit 30 is switched by the frequency changeover switch 30S. The output clock signal CK2 generated here is used as an activating clock signal of LPF 42a provided in the receiving IF-IC 42. That is, it is used as a clock signal for automatically tuning the LPF 42a built in the receiving IF-IC 42.

The output clock signal CK2 is output to the transmission IF-IC 44 as well. The transmission IF-IC 44 is IC for receiving the base band signal and for externally supplying it as a wireless signal. The output clock signal CK2 is used to activate PLL 44a provided in the transmission IF-IC 44. That is, it is used as a reference clock signal of PLL 44a built in the transmission IF-IC 44. Both the LPF 42a in the receiving IF-IC 42 and the PLL 44a in the transmission IF-IC 44 operate only at 600 kHz.

As explained above, the third embodiment is configured to receive the input clock signal CK1 at the receiving IF-IC 42 containing the clock frequency converter circuit 30 and to convert its clock frequency in the clock frequency converter circuit 30, so as to operate LPF 42a in the receiving IF-IC 42 and PLL 44a in the transmission IF-IC 44. Therefore, it is sufficient to provide the clock frequency changeover circuit 30 in the receiving IF-IC 42 alone, and the transmission IF-IC 44 needs no such circuit. Therefore, here again, pins of the semiconductor chip kit SCK can be reduced, and its miniaturization can be attained. That is, the semiconductor chip kit shown here can remove another clock frequency converter circuit, frequency changeover switch and pins therefor which were required in a conventional transmission IF-IC 44.

Additionally, since the greatest common divisor of clock frequencies of input clock signals CK1 which TCXO 40 may generate is selected as the clock frequency of the output clock signal CK2 required in each IC, the circuit arrangement of the clock frequency converter circuit 30 can be simplified.

Moreover, even when the clock frequency of the input clock signal CK1 is changed to any other than the expected two clock frequencies, it is sufficient to redesign only the clock frequency converter circuit 30 in the receiving IF-IC 42 and to replace the receiving IF-IC 42 with redesigned one. Therefore, the semiconductor chip kit can readily cope with any change in clock frequency of the input clock signal CK1 from TCXO 40.

Additionally, since TCXO 40 may supply the input clock signal CK1 only to the receiving IF-IC 42, it is released from a heavy load and needs no additional buffer.

Figure 6A:
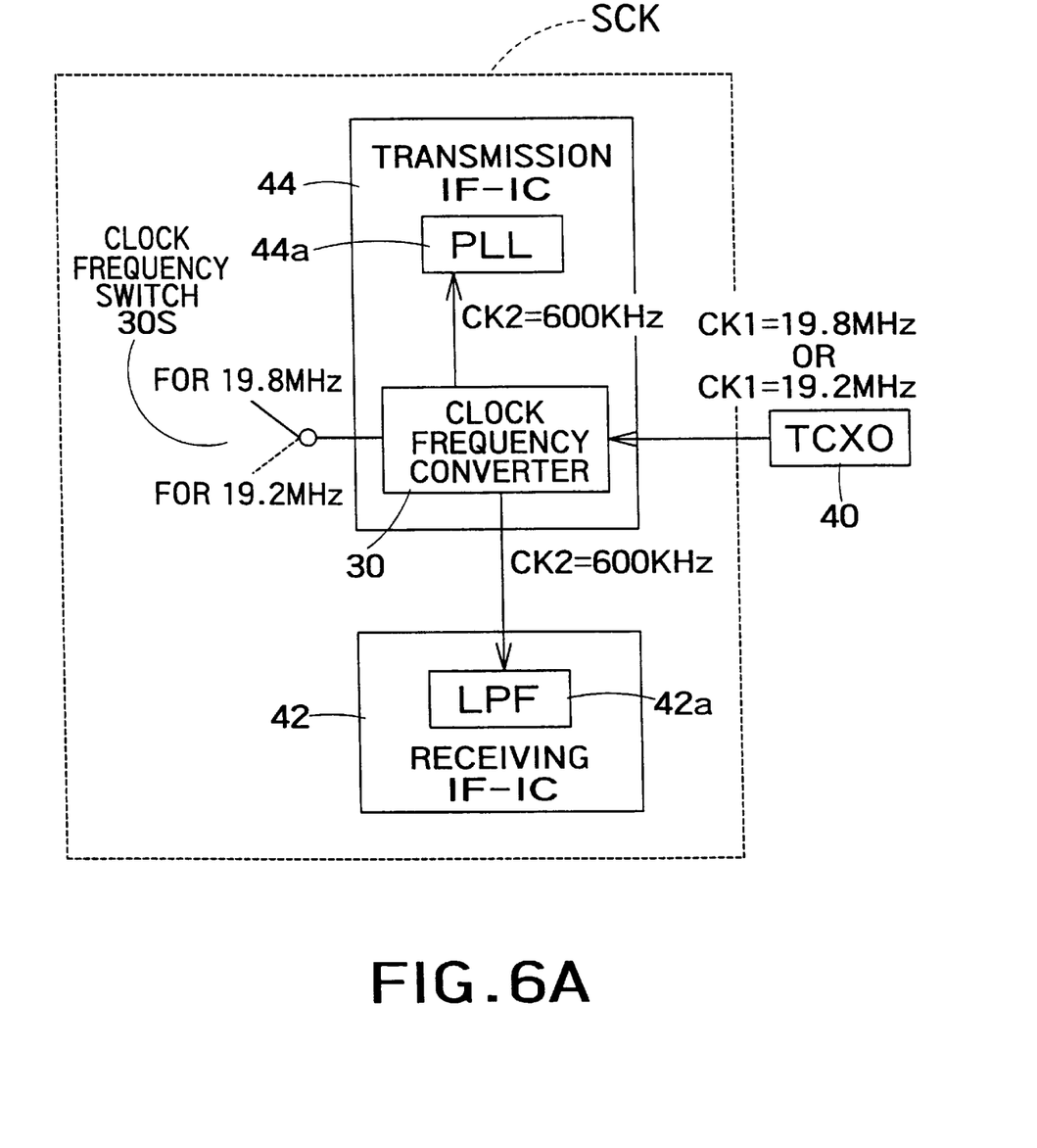
FIG. 6A is a diagram showing a semiconductor chip kit modified from the third embodiment of the invention.

The embodiment shown here may be modified as shown in FIG. 6A where the clock frequency converter circuit 30 is provided in the transmission IF-IC 44 instead of the receiving IF-IC 42.

(Fourth Embodiment)

The fourth embodiment of the invention is an application of the semiconductor chip kit SCK according to the invention to a CDMA (code division multiple access) mobile wireless system. It is explained in greater detail with reference to FIG. 7.

Figure 7:
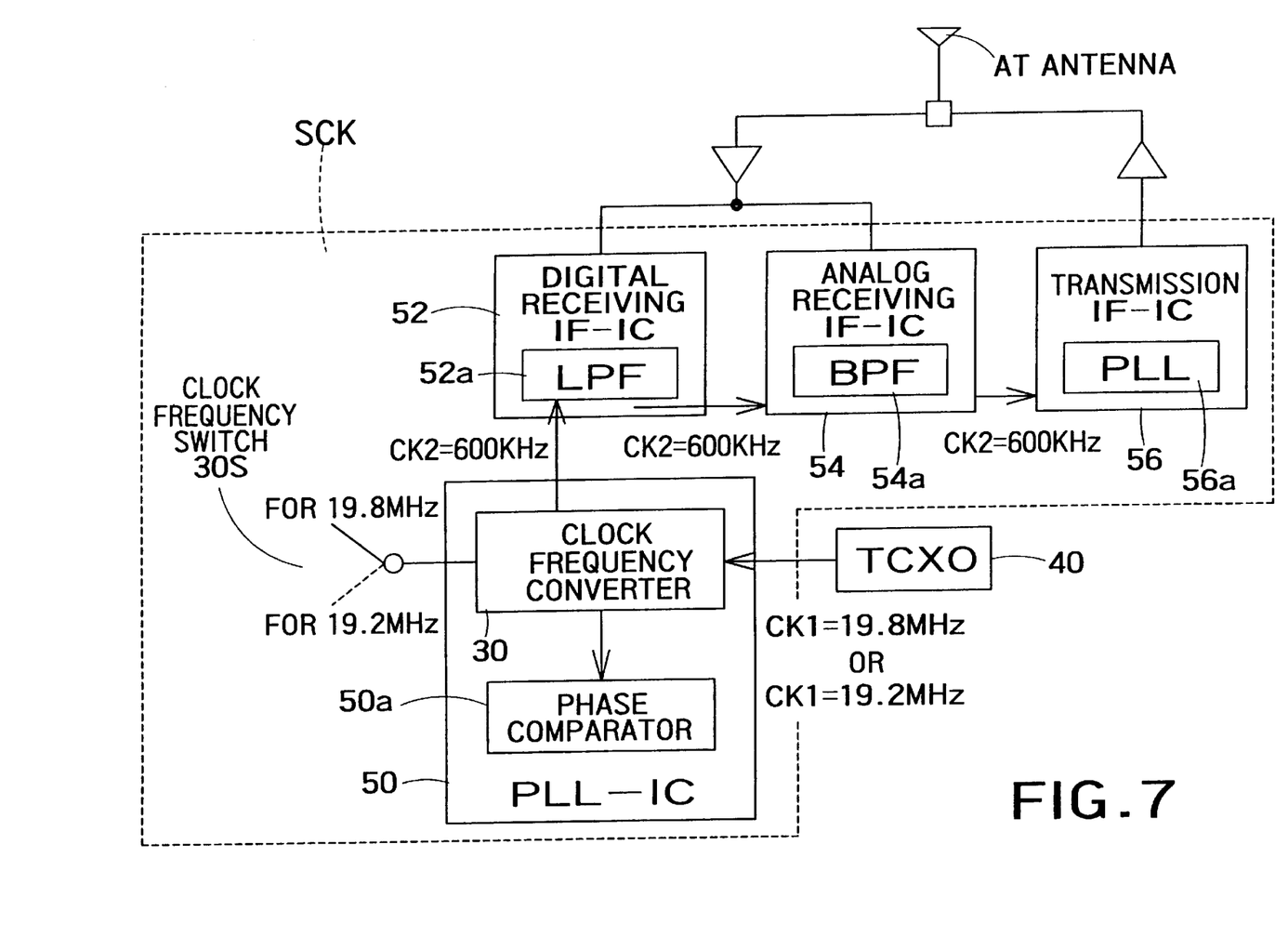
FIG. 7 is a diagram showing a semiconductor chip kit according to the fourth embodiment of the invention.

FIG. 7 is a diagram schematically showing the entire structure of a CDMA wireless portable terminal. As shown in FIG. 7, the wireless portable terminal includes TCXO 40, semiconductor chip kit SCK and antenna AT.

The semiconductor chip kit SCK is provided with PLL-IC 50, digital receiving IF-IC 52, analog receiving IF-IC 54, and transmission IF-IC 56 in form of ICs. The CDMA mobile wireless system employs the so-called dual mode by using two receiving ICs, namely, one being the digital receiving IF-IC 52 for receiving a digital signal from the exterior and for converting it into a base band signal, and the other being the analog receiving IF-IC 54 for receiving an analog signal from the exterior and for converting it into a base band signal. Both the digital receiving IF-IC 52 and the analog receiving IF-IC 54 are connected to the antenna AT to receive both a CDMA radio wave signal in a digital form and a TACS radio wave signal in an analog form. PLL-IC 50 is a circuit for supplying a local signal. The transmission IF-IC 56 is IC for receiving an audio signal and for delivering it to the exterior. Therefore, it is also connected to the antenna AT.

The input clock signal CK1 generated in TCXO 40 is introduced into the clock frequency converter circuit 30 of PLL-IC 50. The clock frequency converter circuit 30 has the same inner structure as that used in the embodiment shown in FIG. 2 or FIG. 3. Here again, the input clock signal CK1 may have the clock frequency of 19.8 MHz or 19.2 MHz. The clock frequency converter circuit 30 is configured to convert the input clock signal CK1 into the output clock signal CK2 with the clock frequency of 600 kHz, whichever clock frequency the received signal CK1 has. The output clock signal CK2 is used as an activating clock signal of a phase comparator circuit 50a provided in PLL-IC 50. The output clock signal CK2 is also supplied to the digital receiving IF-IC 52 as an activating clock signal of LPF 52a in the digital receiving IF-IC 52. That is, it is used as a reference clock of LPF 52a built in the digital receiving IF-IC 52. The output clock signal CK2 is supplied from the digital IF-IC 52 to the analog receiving IF-IC 54 and used as an activating clock signal of BPF (band pass filter) 54a in the analog receiving IF-IC 54. That is, it is used as a reference clock of BPF 54a built in the analog receiving IF-IC 54. The output clock signal CK2 is further output from the analog IF-IC 54 to the transmission IF-IC 56 and used as an activating clock signal of PLL 54a in the transmission IF-IC 56.

Similarly to the other embodiments, also the embodiment shown here can reduce pins of the semiconductor chip kit SCK and attains its miniaturization. Additionally, since PLL-IC 50 is typically a digital circuit, the circuit arrangement of the clock frequency converter circuit 30 can be readily made. Therefore, the semiconductor chip kit shown here has a larger flexibility to changes in clock frequency of TCXO 40. That is, it can more easily cope with changes in clock frequency.

Figure 8:
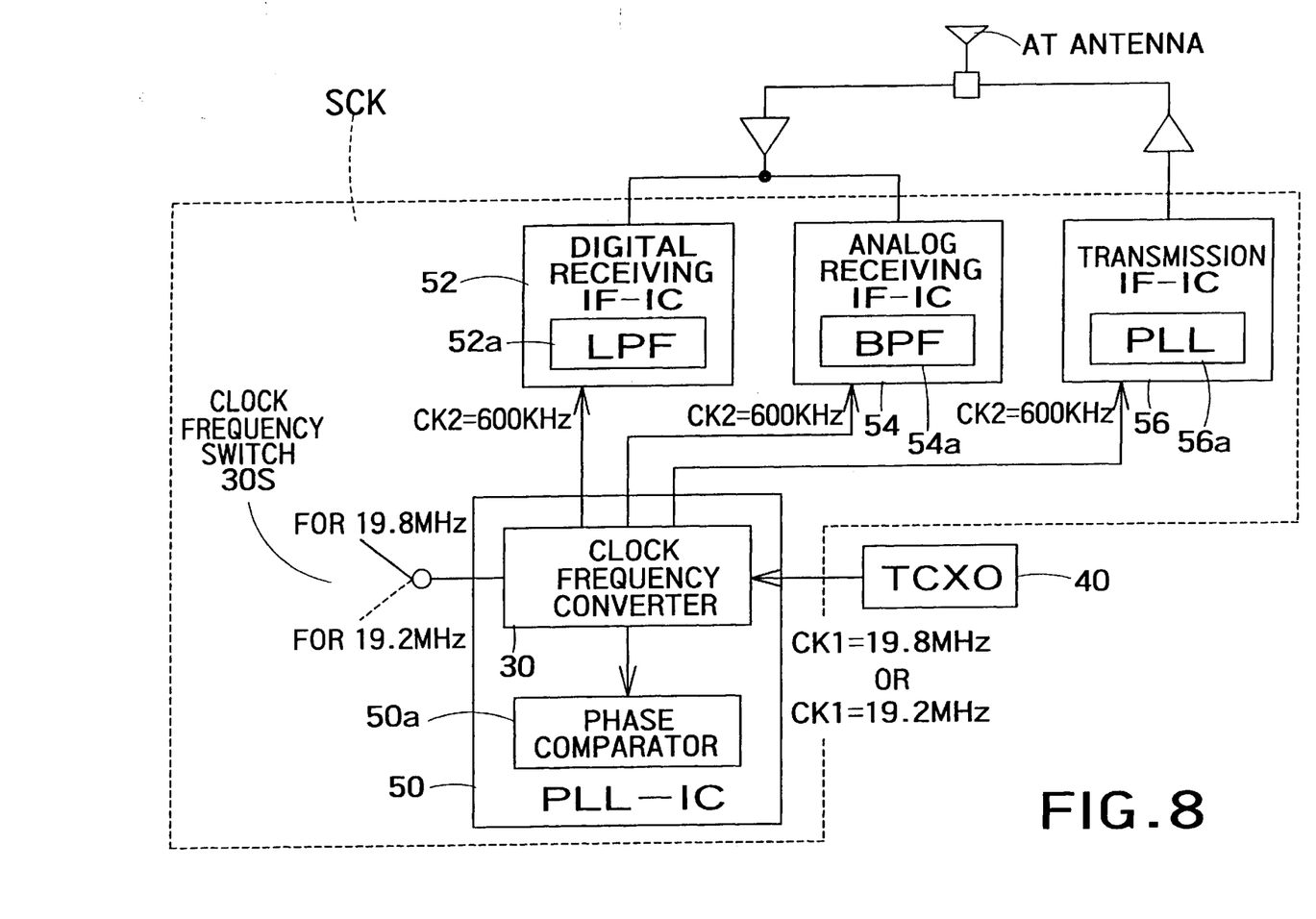
FIG. 8 is a diagram showing a modification of the fourth embodiment of the invention.

The fourth embodiment may be modified as shown in FIG. 8 where the output clock signal CK2 is supplied from the clock frequency converter circuit 30 directly, individually to the digital receiving IF-IC 52, analog receiving IF-IC 54 and transmission IF-IC 56.

The invention is not limited to specific embodiments shown above, but may be changed or modified in various modes. For example, the first IC 21 through third IC 23 shown in FIG. 1, receiving IF-IC 42 and transmission IF-IC 44 shown in FIG. 6, and so forth, may be larger scaled ICs such as LSI or VLSI. The clock frequencies of the input clock signal CK1 are not limited to 19.8 MHZ and 19.2 MHz, but may be a plurality of different clock frequencies which may be three, four or more different frequencies.

As described above, according to the invention, since a clock frequency converter circuit is provided in one of ICs in a semiconductor chip kit to convert an input clock signal with any one of different clock frequencies received from a clock generator into an output clock signal of a predetermined clock frequency and to use it as an operating clock signal of a plurality of ICs, pins of ICs can be reduced, and the semiconductor chip kit can easily cope with changes in clock frequency of the clock signal supplied from the clock generator.

What is claimed is:

1. A semiconductor chip kit, comprising:
   a clock frequency converter circuit having a clock frequency change over switch which is switched depending on a frequency of an input clock signal having any one of different clock frequencies,
   wherein said clock frequency converter circuit frequency-converts said input clock signal into an output clock signal having a predetermined specific clock frequency,
   said clock frequency converter circuit includes a plurality of divider circuits for dividing the frequency of said input clock signal by different divisional ratios,
   said divider circuits being connected in parallel,
   one of said divider circuits being selected depending on the switching of said clock frequency change over switch to convert the clock frequency of said input clock signal into said specific clock frequency,
   said semiconductor chip kit further comprises one or more integrated circuits supplied with and activated by said output clock signal from said clock frequency converter circuit, and
   said integrated circuits are operative only when said integrated circuits receive said output clock signal of said specific clock frequency.

2. The semiconductor chip kit according to claim 1, further comprising an additional divider circuit in common serial connection with said plurality of divider circuits connected in parallel.

3. The semiconductor chip kit according to claim 2, wherein said clock frequency converter circuit includes:
   a first internal switch inputting said input clock signal and outputting said input clock signal to one of said divider circuits, said first internal switch being switched by said clock frequency changeover switch; and
   a second internal switch inputting said output clock signal from said one of said divider circuits and outputting said output clock signal to said additional divider circuit, said second internal switch being switched by said clock frequency changeover switch.

4. The semiconductor chip kit according to claim 2, wherein said specific clock frequency is a common divisor of said clock frequencies of said input clock signal.

5. The semiconductor chip kit according to claim 2, wherein said specific clock frequency is the greatest common divisor of said clock frequencies of said input clock signal.

6. The semiconductor chip kit according to claim 1, wherein said clock frequency converter circuit is provided within said integrated circuit, said output clock signal with said specific clock frequency being output from said integrated circuit to another integrated circuit.

7. The semiconductor chip kit according to claim 6, wherein said clock frequency converter circuit provided within said integrated circuit supplies said output clock signal directly to all of other said integrated circuits provided in said semiconductor chip kit.

8. The semiconductor chip kit according to claim 6, wherein said clock frequency converter circuit provided within said integrated circuit supplies said output clock signal to one or some of other said integrated circuits provided in said semiconductor chip kit, the other or others of other said integrated circuits being supplied with said output clock signal through said one or some of other said integrated circuits.

9. The semiconductor chip kit according to claim 1, wherein said clock frequency converter circuit is provided independently from said integrated circuit, and supplies said output clock signal of said specific clock frequency to said integrated circuits.

10. The semiconductor chip kit according to claim 9, wherein said clock frequency converter circuit provided independently supplies said output clock signal directly to all said integrated circuits provided in said semiconductor chip kit.

11. The semiconductor chip kit according to claim 9, wherein said clock frequency converter circuit provided independently supplies said output clock signal to one or some of said integrated circuits provided in said semiconductor chip kit, and said one or some of said integrated circuits supply said output clock signal to other integrated circuits.

12. The semiconductor chip kit according to claim 1, wherein a plurality of said integrated circuits include a receiving IF-IC which receives a wireless signal from the exterior to convert it into a base band signal, and a transmission IF-IC which receives said baseband signal and supplies it as a wireless signal to the exterior.

13. The semiconductor chip kit according to claim 1, wherein a plurality of said integrated circuits include a digital receiving IF-IC which receives a digital wireless signal from the exterior to convert it into a base band signal, an analog receiving IF-IC which receives an analog wireless signal from the exterior to convert it into the base band signal, a transmission IF-IC which receives the base band signal to supply it as a wireless signal to the exterior, and a PLL-IC for supplying a local signal.

14. The semiconductor chip kit according to claim 1, wherein said clock frequency converter circuit includes:

a first internal switch inputting said input clock signal and outputting said input clock signal to one of said divider circuits, said first internal switch being switched by said clock frequency changeover switch; and a second internal switch inputting said output clock signal from said one of said divider circuits and outputting said output clock signal to said integrated circuits, said second internal switch being switched by said clock frequency changeover switch.

15. A semiconductor chip kit, comprising:

a receiving IF-IC which receives a wireless signal and converts said wireless signal into a base band signal;

a transmission IF-IC which receives said base band signal and transmits said base band signal as a wireless signal; and a clock frequency converter circuit provided in one of said receiving IF-IC and said transmission IF-IC, wherein said clock frequency converter circuit has a clock frequency change over switch which is switched depending on a frequency of an input clock signal having any one of different clock frequencies, said clock frequency converter circuit frequency-converts said input clock signal into an output clock signal having a predetermined specific clock frequency, said clock frequency converter circuit includes a plurality of divider circuits for dividing the frequency of said input clock signal by different divisional ratios, said divider circuits being connected in parallel, one of said divider circuits being selected depending on the switching of said clock frequency change over switch to convert the clock frequency of said input clock signal into said specific clock frequency, one of said receiving IF-IC and said transmission IF-IC is supplied with and activated by said output clock signal from said clock frequency converter circuit, and one of said receiving IF-IC and said transmission IF-IC is operative only when one of said receiving IF-IC and said transmission IF-IC receive said output clock signal of said specific clock frequency.

16. The semiconductor chip kit according to claim 15, wherein said specific clock frequency is a common divisor of said clock frequencies of said input clock signals.

17. The semiconductor chip kit according to claim 15, wherein said specific clock frequency is the greatest common divisor of said clock frequencies of said input clock signals.

18. A semiconductor chip kit, comprising:

a digital receiving IF-IC which receives a digital wireless signal and converts said digital wireless signal into a base band signal;

an analog receiving IF-IC which receives an analog wireless signal and converts said analog wireless signal into the base band signal;

a transmission IF-IC which receives said base band signal and transmits said base band signal as a wireless signal;

a PLL-IC for supplying a local signal; and a clock frequency converter circuit provided in said PLL-IC, wherein said clock frequency converter circuit has a clock frequency change over switch which is switched depending on a frequency of an input clock signal having any one of different clock frequencies, said clock frequency converter circuit frequency-converts said input clock signal into an output clock signal having a predetermined specific clock frequency, said clock frequency converter circuit includes a plurality of divider circuits for dividing the frequency of said input clock signal by different divisional ratios, said divider circuits being connected in parallel, one of said divider circuits being selected depending on the switching of said clock frequency change over switch to convert the clock frequency of said input clock signal into said specific clock frequency, one of said digital receiving IF-IC, said analog receiving IF-IC and said transmission IF-IC is supplied with and activated by said output clock signal from said clock frequency converter circuit, and one of said digital receiving IF-IC, said analog receiving IF-IC and said transmission IF-IC is operative only when one of said digital receiving IF-IC, said analog receiving IF-IC and said transmission IF-IC receive said output clock signal of said specific clock frequency.

19. The semiconductor chip kit according to claim 18, wherein said specific clock frequency is a common divisor of said clock frequencies of said input clock signals.

20. The semiconductor chip kit according to claim 18, wherein said specific clock frequency is the greatest common divisor of said clock frequencies of said input clock signals.

21. A semiconductor chip kit, comprising:

a clock frequency converter circuit having a clock frequency change over switch which is switched depending on a frequency of an input clock signal having any one of different in clock frequencies, wherein said clock frequency converter circuit frequency-converts said input clock signal into an output clock signal having a predetermined specific clock frequency, said clock frequency converter circuit includes a plurality of divider circuits for dividing the frequency of said input clock signal into said output clock signal having said predetermined specific clock frequency which is a common divisor of clock frequencies of said input clock signal and for supplying said output clock signal, said divider circuits being connected in parallel, one of said divider circuits being selected depending on the switching of said clock frequency change over switch to convert the clock frequency of said input clock signal into said specific clock frequency, said semiconductor chip kit further comprises one or more integrated circuits supplied with and activated by said output clock signal from said clock frequency converter circuit, and said integrated circuits are operative only when said integrated circuits receive said output clock signal of said specific clock frequency.

22. A mobile wireless system using a semiconductor chip kit, said semiconductor chip kit comprising:

a clock frequency converter circuit having a clock frequency change over switch which is switched depending on a frequency of an input clock signal having any one of different clock frequencies, wherein said clock frequency converter circuit frequency-converts said input clock signal into an output clock signal having a predetermined specific clock frequency, said clock frequency converter circuit includes a plurality of divider circuits for dividing the frequency of said input clock signal by different divisional ratios, said divider circuits being connected in parallel, one of said divider circuits being selected depending on the switching of said clock frequency change over switch to convert the clock frequency of said input clock signal into said specific clock frequency, said semiconductor chip kit further comprises one or more integrated circuits supplied with and activated by said output clock signal from said clock frequency converter circuit, and said integrated circuits are operative only when said integrated circuits receive said output clock signal of said specific clock frequency.

23. The mobile wireless system according to claim 22, wherein said clock frequency converter circuit includes an additional divider circuit in common serial connection with said plurality of divider circuits connected in parallel.

24. The mobile wireless system according to claim 22, wherein said specific clock frequency is a common divisor of the frequencies of said input clock signals.

25. The mobile wireless system according to claim 22, wherein said specific clock frequency is the greatest common divisor of the frequencies of said input clock signals.

* * * * *